United States Patent
Jacobs et al.

(10) Patent No.: US 7,459,325 B2
(45) Date of Patent: Dec. 2, 2008

(54) MEMS PASSIVATION WITH TRANSITION METALS

(75) Inventors: Simon Joshua Jacobs, Lucas, TX (US); Seth Adrian Miller, Sachse, TX (US)

(73) Assignee: Texas Instruments Incorporated, Dallas, TX (US)

(*) Notice: Subject to any disclaimer, the term of this patent is extended or adjusted under 35 U.S.C. 154(b) by 373 days.

(21) Appl. No.: 11/029,985

(22) Filed: Jan. 5, 2005

(65) Prior Publication Data
US 2005/0145961 A1 Jul. 7, 2005

Related U.S. Application Data

(60) Provisional application No. 60/534,337, filed on Jan. 5, 2004.

(51) Int. Cl.
*H01L 21/00* (2006.01)

(52) U.S. Cl. ............... 438/38; 438/52; 438/763; 438/780; 427/96.2; 427/97.1

(58) Field of Classification Search ............... 438/48, 438/38, 50, 52, 53, 763, 780; 427/96.2, 97.1; 257/642
See application file for complete search history.

(56) References Cited

U.S. PATENT DOCUMENTS

| 5,576,454 | A | * | 11/1996 | Roscher ............... 558/386 |
|---|---|---|---|---|
| 5,602,671 | A | | 2/1997 | Hornbeck |
| 5,694,740 | A | | 12/1997 | Martin et al. |
| 6,146,767 | A | | 11/2000 | Schwartz |
| 6,335,224 | B1 | | 1/2002 | Peterson et al. |
| 6,365,229 | B1 | | 4/2002 | Robbins |
| 6,522,801 | B1 | * | 2/2003 | Aksyuk et al. ............... 385/18 |
| 6,645,644 | B1 | * | 11/2003 | Schwartz et al. ............ 428/632 |
| 6,674,140 | B2 | | 1/2004 | Martin |
| 2003/0002019 | A1 | | 1/2003 | Miller |
| 2003/0211650 | A1 | | 11/2003 | Martin |
| 2004/0026324 | A1 | * | 2/2004 | Luca ............... 210/660 |
| 2004/0071863 | A1 | | 4/2004 | Zhu et al. |
| 2004/0136044 | A1 | * | 7/2004 | Miller et al. ............... 359/223 |

OTHER PUBLICATIONS

Gawalt et al., "Self-Assembly and Bonding of Alkanephosphonic Acids on the Native Oxide Surface of Titanium", Langmuir 2001, 17, 5736-5738.*
Zhu, et.al., "Self-Assembled Monolayer used in Micro-motors".
Gawalt, et. al, "Self-Assembly and Bonding of Alkanephosphonic Acids on the Native Oxide Surface of Titanium," *Langmuir 2001*, 17, 5736-38.
Hanson, et. al, "Bonding Self-Assembled, Compact Organophosphonate Monolayers to the Native oxide Surface of Silicon," *J. Am. Chem. Soc.* 2003, 125, 16074-80.
Nitowski, G., "Topographic and Surface Chemical Aspects of the Adhesion of Structural Epoxy Resins to Phosphorus Oxo Acid Treated Aluminum Adherents".

* cited by examiner

*Primary Examiner*—A. Sefer
*Assistant Examiner*—Scott R Wilson
(74) *Attorney, Agent, or Firm*—Wade J. Brady, III; Frederick J. Telecky, Jr.

(57) ABSTRACT

Organic surfactants are employed to passivate the surfaces of MEMS devices, such as digital micromirrors. The binding of these surfactants to the surface is improved by first associating with the surface transition metal atoms or ions from Groups IVB, VB, and IVB of the periodic table.

7 Claims, No Drawings

MEMS PASSIVATION WITH TRANSITION METALS

RELATED APPLICATIONS

This application claims priority to commonly-owned U.S. provisional patent application Ser. No. 60/534,337, filed Jan. 5, 2004.

FIELD OF THE INVENTION

This invention relates to MEMS devices and the control of stiction, friction, and related processes through the application to such a devices of a passivation layer. Binding of the transition layer to the device surface is enhanced through the use of an intermediate layer formed from complexes of transition metals of Groups IVB, VB, and VIB.

BACKGROUND

MicroElectro Mechanical Systems (MEMS) are semiconductor chips that support a top layer of small mechanical devices, such as fluid sensors or mirrors. These devices are built onto chips through growth and etching processes similar to those used to define the topography of an integrated circuit. These processes are capable of creating devices with micron dimensions. The MEMS itself typically packs multiple devices on a single chip.

A MEMS device, specifically a Digital Micromirror Device (DMD), is the basis for Digital Light Processing™ technology. The DMD microchip functions as a fast, reflective digital light switch. The switching is accomplished through the rotation of multiple small mirrors in response to an electric potential. In a mirror's "on" state of rotation, light from a projection source is directed to the pupil of a projection lens and a bright pixel appears on the projection screen. In the "off" state, light is directed out of the pupil and the pixel appears dark. Thus the DMD provides a digital basis for constructing a projected image. Digital Light Processing™ has been employed commercially in televisions, cinemagraphic projection systems, and business-related projectors.

In a typical DMD design, metal is deposited to form support posts, a hinge, the mirror itself, and structure (such as yokes or landing tips) to contain its rotation. The processes used to define these structures on a DMD (or any other MEMS device) are known in the art and are not the subject of this invention.

Other processes, such as singulation of wafers into die, cleaning, plasma etching, and wire bonding, are used in the production of the final, packaged MEMS device. These processes typically include growth of a passivation layer on the MEMS device.

Passivation layers are added to address several problems with device operation. One such problem is stiction, or the static adhesion force between resting bodies in contact (such as a DMD mirror and a dust particle). Another problem is friction, which arises from the contact of moving elements in the device. Effective passivation layers reduce stiction and friction by reducing the surface energy of the device. Furthermore, passivation layers may serve to retard the accumulation of permanent deformation that may accompany the repeated actuation of a MEMS component by stabilizing certain states of the surface.

Passivation layers are typically formed from surfactants. Effective surfactants are believed to function by forming self-assembled monolayers at the device surface. These monolayers are ordered molecular assemblies formed by the adsorption of a surfactant on a solid surface. Zhu, et.al., "Self-Assembled Monolayer used in Micro-motors," report the use of such monolayers, formed from an octadecyltrichlorosilane precursor, as a passivation layer for a silicon micromotor. Hornbeck, "Low Surface Energy Passivation Layer for Micromechanical Devices" (U.S. Pat. No. 5,602,671) has described the use of self-assembled monolayers as passivation for MEMS devices including DMDs. Suitable self-assembling carboxylates may be introduced as a vapor under conditions designed to facilitate the growth of self-assembled monolayers, as disclosed by Robbins, "Surface Treatment Material Deposition and Recapture," (U.S. Pat. No. 6,365,229).

Self-assembled monolayers have been studied outside the device context. Much of the early research in this field concerned the interaction of surfactants with gold surfaces; but work has been published relating to other metals (and metalloids), including silicon and aluminum. Work pertaining to phosphonate/phosphonic acid surfactants includes: Gawalt, et. al, "Self-Assembly and Bonding of Alkanephosphonic Acids on the Native Oxide Surface of Titanium," *Langmuir* 2001, 17, 5736-38; Hanson, et. al, "Bonding Self-Assembled, Compact Organophosphonate Monolayers to the Native oxide Surface of Silicon," *J. Am. Chem. Soc.* 2003, 125, 16074-80; and Nitowski, G., "Topographic and Surface Chemical Aspects of the Adhesion of Structural Epoxy Resins to Phosphorus Oxo Acid Treated Aluminum Adherents."

Within the device context, the passivation layer should be stable under the intended operating conditions of the MEMS. While carboxylate surfactants have functioned adequately in commercial DMD products, the resulting monolayers may desorb under foreseeable conditions of operation. Such desorption, and the resulting increase in stiction, friction, and hinge memory accumulation, would adversely impact the operation of the device. It is therefore desirable to form passivation layers from surfactants that bind more tightly with the surface of interest.

Transition metal complexes may be used to strengthen the bond of a monolayer to a surface. U.S. Pat. Nos. 6,146,767 and 6,645,644 disclose the reaction of alkoxides of Group IV-VIB transition metals with an oxidized metal surface, followed by reaction with a carboxylate, phosphate, phosphonate, or pi-electron donor (such as an aromatic) to yield a self-assembled monolayer of the latter compound. These patents propose that covalent bonding of the monolayer molecules to the transition metal improve the stability of the resulting film. Neither patent discloses the use of transition metal complexes in the passivation of a MEMS device surface.

SUMMARY OF THE INVENTION

The invention provides methods for assembling a passivation layer on the surface of a MEMS device. The methods include a step of contacting the device surface with a Group IV-VIB transition metal. The metal may be introduced through electrochemical deposition, or as a complex of one or more of the following ligands: amine, siloxane, cyanate, isocyanate, thiocayanate, and isothiocyanate. A self-assembled monolayer is then constructed from a suitable organic ligand, such as a carboxylate, phosphate, phosphonate, xanthate, carbamate, thiocarbamate, thiocarboxylate, thiolate, sulfonate, sulfinate, or selenate. In specific embodiments, the organic ligands are introduced through vapor deposition or by precipitation from solution.

The invention also provides MEMS device (such as a digital micromirror) having passivation layers of improved stability. A Group IV-VIB transition metal is introduced to the surface of these devices, through electrochemical deposition, or as a complex of one or more of the following ligands: amine, siloxane, cyanate, isocyanate, thiocayanate, and isothiocyanate. A self-assembled monolayer is then constructed from a suitable organic ligand, such as a carboxylate, phosphate, phosphonate, xanthate, carbamate, theocarbamate, thiocarboxylate, thiolate, sulfonate, sulfinate, or selenate. In specific embodiments, the organic ligands are introduced through deposition from either vapor or solution phases.

DETAILED DESCRIPTION OF THE INVENTION

The mechanical structures of a MEMS device are grown on a semiconductor surface through any of a variety of methods that are known in the art. These methods may include conventional semiconductor processing techniques like sputter metal deposition, lithography, and plasma etching.

Fabrication of a Digital Micromirror Device

In one example, a DMD superstructure is grown on an SRAM address circuit employing standard CMOS technology. A thick oxide is deposited over Metal-2 of the CMOS and planarized through chemical mechanical polishing to yield a flat substrate for DMD fabrication. Construction of the DMD superstructure begins with deposition and patterning of aluminum for a metal layer. An organic sacrificial layer (spacer) is then spin-coated, lithographically patterned and hardened. Holes patterned in the spacer will form metal support posts after the yoke metal covers their sidewalls. These posts will support the hinges and the mirror address electrodes.

A second metal layer is sputter-deposited and patterned to form the hinges and other elements, such as springs, supports, electrodes, or mechanical stops that may be desirable for control of micromirror motion.

A second organic sacrificial layer is spin-coated, patterned, then hardened. The holes patterned in this spacer form the support posts that secure the mirrors to the underlying yokes. An aluminum layer is sputter-deposited and patterned over this spacer to form the mirrors. A final coating of photoresist completes the wafer.

Through standard semiconductor processes, the wafers are singulated, and the individual die are mounted in ceramic headers. A plasma etching step is then used to remove the photoresist from among the MEMS structures, thereby freeing the superstructure.

Device Passivation

After the device superstructure has been fabricated, one or more metals of Groups IVB, VB and VIB are brought to its surface. In one embodiment, this is done through electrochemical deposition. The MEMS device is placed in a solution (aqueous or non aqueous) containing a source of transition metal ion, preferably salts of Zi(III) and Ti(III). The corresponding metal is used as a sacrificial anode. Once the deposition has reached the desired end point, polarity may be reversed to oxidize the metal. Electrochemical deposition on silicon wafers may be done in commercial equipment, such as that available from Semitool Corporation.

Alternatively, the Group IVB-VIB transition metal may be introduced as a vapor of a transition metal complex. Amine, siloxane, cyanate, isocyanate, thiocayanate, and isothiocyanate complexes are useful for this purpose. Tetrakis(dimethylamino)-complexes are preferred, since dimethylamine is volatile and easily removed in subsequent processing. Tetrakis(dimethylamino)titanium and tetrakis(dimethylamino)zirconium are especially preferred. Vapor deposition should be conducted at reduced pressure and temperature in an inert environment. Commercial instruments sold by ASM Lithography and Applied Microsystem Technology are suitable for these processes.

After the Group IVB-VIB transition metal is bound to the surface of the MEMS device, the surface is contacted with an organic surfactant. Suitable organic surfactants include carboxylates, phosphates, phosphonates, xanthates, carbamates, thiocarbamates, thiocarboxylates, thiolates, sulfonates, sulfinates, and selenates. The surfactant may be introduced as a salt or acid. Preferred surfactants are those having a single hydrocarbon straight chain of four to eighteen carbon atoms. The hydrocarbon straight chain may be saturated or unsaturated, partially or fully fluorinated, and may include linear hetero atoms, such as oxygen.

Especially preferred organic surfactants are carboxylates and alkyl phosphonic acids. Methods for synthesizing alkyl phosphonic acids and esters are disclosed in, e.g., U.S. Pat. Nos. 4,108,889; 4,393,011; and 4,655,883. Suitable carboxylates and phosphonates include materials sold commercially as lubricants. For reasons of availability, perfluorodocanoic acid (PFDA) n-octylphosphonic acid (NOPA) and octadecylphosphonic acid (NOPA) are especially preferred surfactants.

The organic surfactant is contacted with the surface to be coated under conditions selected to facilitate the formation and adsorption of a self-assembled monolayer. The surface may be exposed to a vapor of the organic surfactant—typically at or near the native surfactant vapor pressure, under vacuum, at temperatures below 150° C. Alternatively, the organic surfactant may be adsorbed from solution. Suitable solution-based methods include the THF/aerosol method disclosed in Gawalt, et. al, and the THF/evaporation method disclosed in Hanson, et. al. Water, isopropyl alcohol, and supercritical $CO_2$ are other solvents that may be useful in the adsorption of organic surfactant monolayers on the surfaces of interest.

The absorption end point can be verified through a contact angle measurement on a sample surface. The process is substantially complete when the water contact angle exceeds 100 and/or when the methylene iodide contact angle exceeds 70.

Covalent bonding of the organic surfactant to the Group IVB-VIB transition metal should improve the stability of the resulting monolayer. In certain embodiments of the invention, it may be desirable to precede the introduction of the organic surfactant with an intermediate metathesis involving water, an alcohol, or an amine.

What is claimed is:

1. A method for fabricating a MEMS device comprising:
   electrochemically depositing on a surface of said device a transition metal of Group IVB VB, or VIB of the periodic chart, optionally oxidizing said metal through chemical or electrochemical means, and
   contacting said surface with an organic surfactant.

2. The method of claim 1, wherein said contacting with an organic surfactant forms a self-assembled monolayer of said surfactant.

3. The method of claim 1, wherein said transition metal is zirconium or titanium, and said organic surfactant comprises a carboxylate, phosphate, phosphonate, xanthate, carbamate, thiocarbamate, thiocarboxylate, thiolate, sulfonate, sulfinate, or selenate.

4. The method of claim 3, wherein said surfactant comprises a compound of either the formula $RCO_2H$ or the formula $RPO(OH)_2$, or salts of the same, or mixtures of the same, where R is a hydrocarbon straight chain of 4-18 carbon atoms; saturated or unsaturated; non-, partially-, or fully-fluorinated; and may include one or more linear hetero atoms.

5. The method of claim 3, wherein said surfactant comprises perfluorodocanoic acid, n-octylphosphonic acid, octadecylphosphonic acid, salts of the same, or mixtures of the same.

6. The method of claim 1, wherein said MEMS device is a digital micromirror device.

7. The method of claim 6, wherein said transition metal is zirconium or titanium, and said organic surfactant comprises a carboxylate, phosphate, phosphonate, xanthate, carbamate, thiocarbamate, thiocarboxylate, thiolate, sulfonate, sulfinate, or selenate.

* * * * *